United States Patent [19]
Inoue et al.

[11] Patent Number: 5,491,401
[45] Date of Patent: Feb. 13, 1996

[54] STABILIZED PLURAL OUTPUT TRANSISTOR POWER SOURCE DEVICE HAVING A PLURALITY OF LIMITING CURRENT CONTROL CIRCUITS

[75] Inventors: Koichi Inoue; Takeshi Morishita, both of Kyoto, Japan

[73] Assignee: Rohm Co., Ltd., Kyoto, Japan

[21] Appl. No.: 329,073

[22] Filed: Oct. 25, 1994

[30] Foreign Application Priority Data

Oct. 26, 1993 [JP] Japan .................... 5-290137

[51] Int. Cl.$^6$ .................... G05F 1/40; G05F 3/04; H02H 7/00
[52] U.S. Cl. .................... 323/273; 323/312; 323/908; 361/18
[58] Field of Search .................... 323/223, 225, 323/226, 266, 268, 269, 270, 271, 272, 273, 276, 277, 281, 282, 289, 312, 315, 316, 317, 908; 327/534, 535, 538, 545, 309, 318, 322; 361/18, 79, 93

[56] References Cited

U.S. PATENT DOCUMENTS

| | | | |
|---|---|---|---|
| 4,398,252 | 8/1983 | Frait | 364/426.1 |
| 4,881,023 | 11/1989 | Perusse et al. | 323/273 |
| 5,168,175 | 12/1992 | Endo | 327/430 |
| 5,200,879 | 4/1993 | Sasagawa et al. | 361/18 |
| 5,212,616 | 5/1993 | Dhong et al. | 361/18 |
| 5,343,141 | 8/1994 | Metro et al. | 323/908 |
| 5,365,161 | 11/1994 | Inoue | 323/282 |
| 5,384,529 | 1/1995 | Nakago | 323/312 |
| 5,387,830 | 2/1995 | Kukimoto | 327/322 |
| 5,428,287 | 6/1995 | Agiman | 323/284 |

*Primary Examiner*—Matthew V. Nguyen
*Attorney, Agent, or Firm*—Fay, Sharpe, Beall, Fagan, Minnich & McKee

[57] ABSTRACT

An IC type stabilized power source circuit being provided with n pieces of output transistors, each outputting to a common terminal; n pieces of over current detection circuits provided for the n pieces of the respective output transistors and outputting respective detection signals when the output currents flowing through the respective corresponding output transistors exceed predetermined rated current values set for the respective corresponding output transistors. N pieces of control circuits are provided for the n pieces of the over current detection circuits and when receiving the respective corresponding detection signals, each limiting the output currents to the respective corresponding output transistors in relation to the over current detection circuits from which the detection signals are received to respective values equal to or less then the respective predetermined rated current values.

7 Claims, 5 Drawing Sheets

STABILIZED PLURAL OUTPUT TRANSISTOR POWER SOURCE DEVICE HAVING A PLURALITY OF LIMITING CURRENT CONTROL CIRCUITS

BACKGROUND OF THE INVENTION

1. Field of the Invention

The present invention relates to a stabilized power source circuit incorporated in an IC and an IC itself. More specifically, the present invention relates to; an IC incorporating a power source circuit which facilitates design of a stabilized power source circuit having a required rated output current, and further facilitates the layout thereof in relation to other circuits to be integrated and is able to supply current with plenty of room with respect to a maximum supply current.

2. Description of Related Art

FIG. 9 shows an example of conventional stabilized power source circuits incorporated in an IC. Further, FIG. 10 shows a stabilized power source circuit in which an over current detecting transistor Qp' having 1/n emitter area is provided of which a base is connected in common with the base of an output transistor (power transistor) Qp.

In the both drawings, the stabilized power source circuits include a reference voltage source 1 which generates reference voltage Vr, an output voltage detection circuit 2 which generates a detection voltage Vf by dividing the output voltage Vo of the stabilized power source circuit with resistors R1 and R2, and an error amplifying circuit 3 which amplifies an error component between the reference voltage Vr and the detection voltage Vf and outputs the same. These circuits further include a transistor Qp which receives at the base thereof the output from the error amplifying circuit 3 via control of a current control circuit 5 and an over current detection circuit 4 which detects an over current of the output current from the transistor Qp and sends out a detection signal to the current control circuit 5.

In the stabilized power source circuits, the transistor Qp functions as a regulation transistor which lowers the source voltage Vcc down to the output voltage Vo depending on the output from the error amplifying circuit 3. In FIG. 10, when the transistor Qp' operates together with the regulation transistor Qp and detects a 1/n over current at 1/n collector current of the transistor Qp at the transistor Qp', an over current of the output transistor Qp is detected.

With these circuits an error signal A corresponding to a deviation amount of the output voltage Vo from a target value is generated so as to perform a control to achieve Vf=Vr, in that the output voltage Vo is controlled so as to reach the target value (Vr×(R1+R2)/R2) of a constant value. Even when the power source voltage Vcc fluctuates or when the condition of the load side receiving the output voltage Vo varies, the output voltage Vo is more or less stabilized at the target value.

Further, the error signal is in principle generated depending on the difference of the output voltage Vo from the target value, however in practice, a predetermined rate, for example R2/(R1+R2) is generally multiplied to the output voltage Vo to determine a lower detection voltage Vf, likely the same rate R2/(R1+R2) is multiplied to the target voltage value to determine a lower reference voltage Vr, then a control is performed so as to coincide these two lowered voltages while generating an error signal thereof.

The over current detection circuit 4 detects the moment when a current more than a rated current of the transistor Qp flows through the collector of the transistor Qp. The current control circuit 5 is for controlling the operating current of the error amplifying circuit 3 in response to the detection signal, and is normally fed from the current source of the error amplifying circuit 3. These circuits detect a moment when the output current via the transistor Qp or the transistor Qp' has exceeding or immediately before exceeds the rated current of the transistor Qp by the over current detection circuit 4 and limit the output current while suppressing the operating current of the error amplifying circuit 3 by the current control circuit 5. Namely, these circuits serve as a protective circuit for the transistor Qp.

When an over current is detected, amplification rate of the error amplifier 3 reduces, an increase of the error signal A is suppressed and an increase of the output current is thus suppressed prior to stabilization of the output voltage Vo. As a result, the output current is limited to be equal to or less than the rated output current value of the output transistor Qp. Thereby, breakdown of the output transistor Qp as well as an IC incorporating the same is prevented. Further, the target value determined with regard to the output voltage Vo is normally set within a range not exceeding the rated current.

In these conventional stabilized power source circuits incorporated into an IC, a power transistor is used for controlling the output voltage. An area of the transistor region of a power transistor is designed to be large for permitting a large current flow so that the power transistor is required to have measures for preventing a local current concentration and for making the current density uniform. Further, the power transistor is required to be designed to make the wiring resistance uniform and to suppress process variation. On one hand, in such power transistor, the occupying area increases depending on an increase of the rated current which makes the layout thereof difficult and requires long design hours.

Further, since such operating characteristics as a possible current flow capacity and a safe operating region of a power transistor are not simply proportional to the area of the transistor region, there remained a problem that an accurate performance of a stabilized power source circuit can not be determined before producing experimental pieces and checking the actual operating results thereof. With regard to such power transistors the design efficiency is low and the development risk thereof is high. Further, for the rated current determined for a power transistor there appears to be variation such that the rated output current has to be designed with some room. However, in response to the provision of such room, the area occupying rate thereof in the integrated circuit increases and the layout thereof becomes difficult in connection with other circuits to be integrated. Further, in response to the scale increase of other circuits to be integrated, the rated output current of the power transistor increases and the occupying area of the stabilized power source circuit increases which makes it more and more difficult to form the same in a single chip IC.

SUMMARY OF THE INVENTION

An object of the present invention is to provide an IC type stabilized power source circuit which facilitates design of a stabilized power source circuit having a required rated output current and further facilitates the layout thereof in relation to other circuits to be integrated.

Another object of the present invention is to provide an IC incorporating a stabilized power source circuit which facilitates design of a stabilized power source circuit having a required rated output current, and further facilitates forming into one chip in relation to other circuits to be integrated and is able to supply current with plenty of rooms with respect to a maximum supply current.

For achieving the above objects, the feature of the stabilized power source circuit according to the present invention is to provide n pieces of output transistors (wherein n is a positive integer equal to 2 or more than 2) each outputting to a common output terminal; n pieces of over current detection circuits provided for the n pieces of the respective output transistors and outputting respective detection signals when the output currents flowing through the respective corresponding output transistors exceed predetermined rated current values set for the respective corresponding output transistors; and n pieces of control circuits provided for the n pieces of the over current detection circuits and when being received the respective corresponding detection signals each limiting the output currents of the respective corresponding output transistors relating to the over current detection circuits from which the detection signals are received to respective values equal to or less than the respective predetermined rated current values, and is to design the total of the respective predetermined rated currents of the n pieces of the respective output transistors to be a rated out current from the common output terminal.

Through the provision of the separate n pieces of output transistors, of over current detection circuits which detect an over current flowing through the respective output transistors and of control circuits which in response to the detection signals from the respective over current detection circuits limit the currents of the respective output transistors so as not to exceed the respective predetermined rated currents, and through the use of the grand total of the rated current values of the respective output transistors as the rated output current of the stabilized power source circuit, the respective output circuits can be designed separately in n pieces of distributed areas. Accordingly, design freedom with regard to the operating characteristics such as the possible current flow capacity and the safe operating region of the stabilized power source circuit is increased.

Explaining in more detail with regard to the relationship between variation of the individual rated currents set for the respective output transistors and the total rated output current, the present invention is different from such arrangement wherein a plurality of output transistors are simply provided in parallel. A set of an output transistor, an over current detection circuit and a control circuit constitutes a unit output circuit and a plurality of the unit output circuits are connected in parallel to an output terminal of a stabilized power source circuit.

Such output transistors combined with the respective over current detection circuits and control circuits have separately set individual rated currents as their upper limit values. When these circuits are formed into an IC, since there exists characteristic variation in a plurality of the unit output circuits, it results that even when output currents of a part of the unit output circuits reach their upper limit values, the operation of the other remaining unit output circuits is not limited. However, in general designing, the rated current value of output transistors determined in relation to an associated over current detection circuit and control circuit is set at a lower limit value in their variation in view of the safety of the circuits, therefore, when many of the unit output circuits are integrated the actual individual rated currents of the respective unit output circuits scatter above the set lower rated current value. Accordingly, even when the output current of an output transistor in a certain unit output circuit reaches its actual rated current value, the output current of another output transistor having a higher actual rated current value in another unit output circuit has not yet reached its upper limit. Therefore, so long as there still exist further unit output circuits having higher actual rated current values, the stabilized power source circuit has room which definitely increases its output rated current determined by the grand total of the individual actual rated current values of the respective unit output circuits. Namely, the grand total of the variation components of the individual actual rated currents from the set lower rated current value represents a degree of room for the output rated current of the stabilized power source circuit.

Accordingly, in the course of designing the respective unit output circuits, it is sufficient when individual unit output circuits of which rated currents are individually set are simply designed and it is unnecessary to take into account of the degree of room for the large entire rated output current of the stabilized power source circuit. The individual rated current values of the output transistors in the respective unit output circuits correspond to one of n divided small values of the entire rated output current of the stabilized power source circuit. Therefore the designing requirements with regard to the operating characteristics such as the possible current flow capacity and the safe operating region are relaxed and the designing works therefor are facilitated. Moreover, individual rated current values are small values. Therefore, the corresponding variation of the individual rated current values is reduced. As a result, an error in the entire output rated current determined by the grand total of the individual values is small and a grand total area occupied by the respective output transistors can be treated as the area for a totalled output transistor. The individual unit output circuits are independently disposed in the layout, a useless area therein is reduced, further without actually producing experimental pieces and checking the operation results, the actual operation results come close to the design specification as intended and the performance of the stabilized power source circuit can be predicted.

DESCRIPTION OF THE PREFERRED EMBODIMENTS

Figure 1:
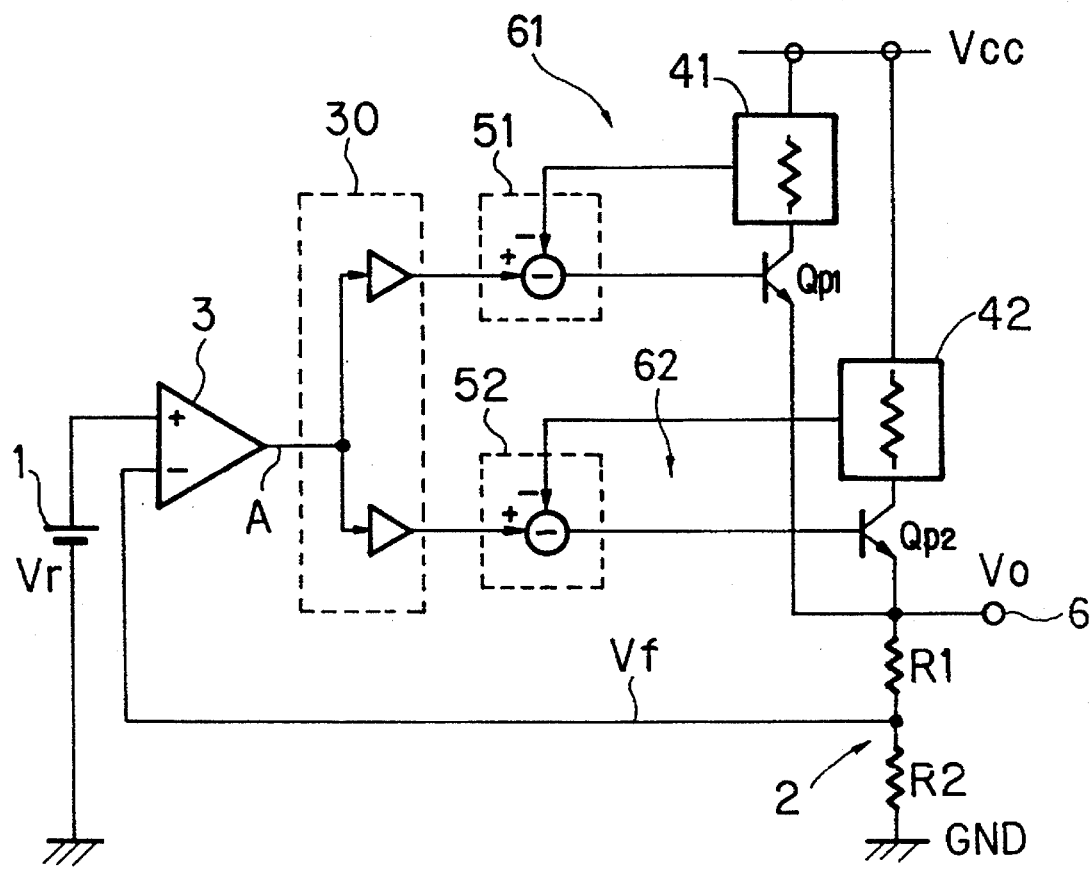
FIG. 1 is a block diagram of one embodiment of basic IC type stabilized power source circuits having two unit output circuits according to the present invention.
Figure 9:
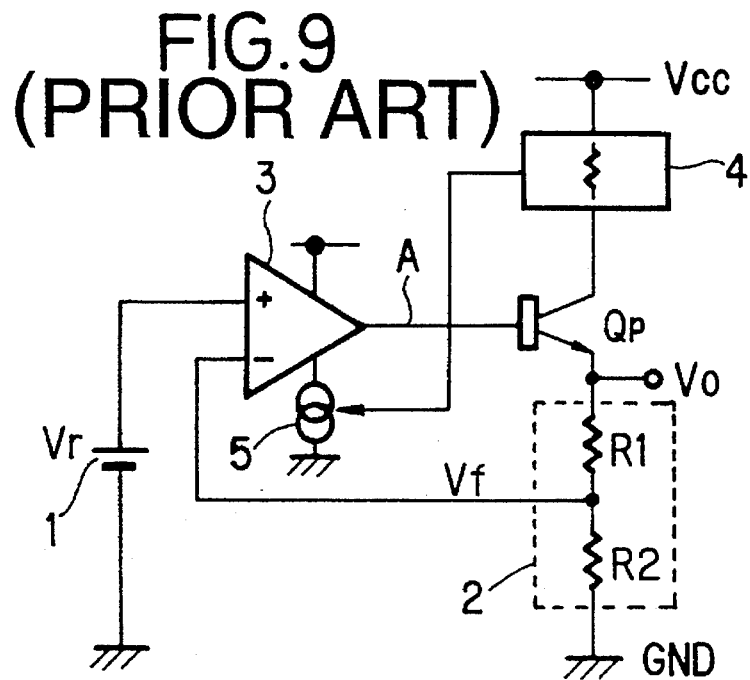
FIG. 9 is a block diagram of an example of conventional IC type stabilized power source circuits.

The constitutional differences of the FIG. 1 embodiment from the FIG. 9 example are that the over current detection circuit 4, the current control circuit 5 and the output transistor Qp in FIG. 9 are replaced by unit output circuits 61 and 62 connected in parallel to an output terminal 6. The unit output circuits 61 and 62 respectively comprise output transistors Qp1 and Qp2, over current detection circuits 41 and 42, and subtraction circuits 51 and 52. Further, between the unit output circuits 61 and 62 and the error amplifying circuit 3 a signal distributing circuit 30 is provided.

The output transistors Qp1 and Qp2 are similar to the output transistor Qp in FIG. 9, however their rated output currents are lower than that of the power transistor Qp.

The signal distributing circuit 30 duplicates the error signal A outputted from the error amplifying circuit 3 by the number corresponding to the number of the unit output circuits and sends out the same to the respective unit output circuits. The signal distributing circuit 30 is, for example, constituted by a plurality of current mirror circuits which share an input side transistor, which will be explained later. In this arrangement the input side transistor in the current mirror circuits receives an error current signal and two output side transistors in the current mirror circuits respectively produce a current signal having the same current value as the error signal A. The two produced current signals are sent out respectively to the subtraction circuits 51 and 52. When the signal distributing circuit 30 is constituted by the current mirror circuits as explained above, it is only necessary to increase the number of output side transistors in the current mirror circuits so as to match the number of unit output circuits so that the signal distributing circuit 30 easily responds to an increase of the unit output circuits.

The over current detection circuits 41 and 42 are circuits like the over current detection circuit 4 and are respectively connected to the collector sides of the output transistors Qp1 and Qp2. These over current detection circuits 41 and 42 are, for example, composed of resistors inserted to the collectors of the transistors Qp1 and Qp2 and detection use transistors which receive the voltages generated at the resistors as base-emitter voltages. The resistance value of the resistor is selected in such a manner that when the collector current of the output transistor Qp1 has reached the rated current value of the output transistor Qp1 the detection use transistor is turned on. The detection currents which are generated when the detection use transistors are turned on are respectively sent out to the subtraction circuits 51 and 52. Further, the detection current increases depending on the magnitude of the output current over the rated current set for the concerned output transistor.

The subtraction circuits 51 and 52 constitute a current control circuit and perform subtraction, for example, by phase inverting the detection signal with respect to the error signal and through wired connection of these outputs. Thereby, the processing of subtracting the respective detection current components sent out from the over current detection circuits 41 and 42 from the current signal sent out from the signal distributing circuit 30 is performed. The subtracted current signals are outputted to the respective bases of the output transistors Qp1 and Qp2.

Further, the combined circuit of the over current detection circuits 41 and the subtraction circuit 51 or the over current detection circuit 42 and the subtraction circuit 52 constitutes a so called current limiting circuit with respect to the output current of the output transistor.

Herein, the current signal from the signal distributing circuit 30 corresponds to the error signal A. The respective detection currents from the over current detection circuits 41 and 42 are never generated unless the collector currents of the respective output transistors Qp1 and Qp2 reach to the respective rated current values. Accordingly, when the collector currents of the output transistors Qp1 and Qp2 are below the respective rated current values of the output transistors Qp1 and Qp2, the respective output transistors Qp1 and Qp2 permit the output to flow depending on the error signals from the power source line Vcc to the output terminal 6. The voltage Vo of the output terminal 6 at this moment is controlled so as to reach the target value (Vr×(R1+R2)/R2) through control of the drop voltage amount (Vcc-Vo) from the power source voltage Vcc to the output voltage.

The output current at this moment of the stabilized power source circuit is the sum of the respective collector currents of the output transistors Qp1 and Qp2, and the maximum output current thereof is the sum of the respective rated currents.

An important factor in the present embodiment is that the rated output current values of the respective output transistors Qp1 and Qp2 which are actually subjected to limitation can not be made uniform because of characteristic variation of such as the over current detection circuits 41 and 42, the sutraction circuits 51 and 52 and the signal distribution circuit 30.

Therefore, the operation of the stabilized power source circuit near at its maximum output current is explained.

Now, assuming that the actually set rated current of the output transistor Qp1 is Ia, that of the output transistor Qp2 is Ib and Ia<Ib.

Depending on an output increase of the stabilized power source circuit, when the collector current of the output transistor Qp1 exceeds the rated current value Ia of the output transistor Qp1, a detection current from the over current detection circuit 41 is generated which is subtracted from the current signal from the signal distributing circuit 30. Thus, a lower base current than that when an over current is generated is supplied to the output transistor Qp1. Namely, the base drive signal of the output transistor Qp1 is held at one for controlling the output current at equal to or less than the rated current value Ia and the output current increase of the output transistor Qp1 is suppressed. Thereby, the output transistor Qp1 is protected. However, since the collector current of the output transistor Qp2 has not yet exceeded the rated current value Ib at this moment, the output of the stabilized power source circuit still has room.

Further, when the collector current of the output transistor Qp2 exceeds the rated current value Ib of the output transistor Qp2 in response to further output increase of the stabilized power source circuit, the over current detection circuit 42 is operated to generate a detection current therefrom. Thereby, in the like manner, the output current of the output transistor Qp2 is limited equal to or less than the rated output current Ib and the output transistor Qp2 is protected. Thus, the output current of the stabilized power source circuit is kept at Ia+Ib.

When it is assumed in the present embodiment that the rated output current Ia of the output transistor Qp1 is designed to be 1 A, then Ia+Ib will be more than 2 A. Further, the occupying areas on the IC of the respective output transistors Qp1 and Qp2 can be allocated independently and the respective unit output circuits 61 and 62 can be distributedly disposed.

However, being affected by such a disposition in the IC region and the production process, hfe of the output transistor Qp1 can be two times larger than the hfe of the output transistor Qp2. Even in such an instance, the stabilized power source circuit FIG. 1 operates effectively. Namely, in this instance the output current of the output transistor Qp1 is in normal operation doubled for that of the output transistor Qp2.

Now, at first when a load (not shown) which is applied of the output voltage Vo is in a light condition, more specifically, when an output current to be supplied the output to the load is less than 1.5A, both transistors Qp1 and Qp2 are operating in a condition below their rated current (=1A) such that both output currents are never limited. The output transistor Qp1 supplies ⅔ output current and the output transistor Qp2 supplies ⅓ output current. Thereby the current required by the load is outputted and the output voltage Vo is generated at the load and is maintained at the control target (a constant value).

Secondly, an operation when the load condition changes and the output current to be supplied to the load reaches to 1.5A is explained. In such an instance, the output transistor Qp1 supplies ⅔ output current, namely 1A and the output transistor Qp2 supplies ⅓ output current, namely the remaining 0.5A. Since the output current of the output transistor Qp1 reaches its rated current 1A, the current limiting circuit composed of the over current detecting circuit 41 and the subtracting circuit 51 begins its operation. When the current limiting circuit operates, the output current of the output transistor Qp1 remains at its rated current 1A.

Thirdly, when the output current to be supplied to the load exceeds 1.5A, the output current of the output transistor Qp1 remains at its rated current as it is and the output transistor Qp2 supplies the remaining output current exceeding 1A. Such operating condition continues until the output current to be supplied to the load reaches 2A. Thus when the output current reaches to 2A, then the output current of the output transistor Qp2 begins to be limited. In this instance, the output current 2A constitutes the upper limit of the grand total output current. Accordingly, in the present instance too the rated output current of the IC type stabilized power source circuit shows 2A.

As explained above, when two sets of unit output circuits 61 and 62 are connected in parallel, the rated output current is doubled, thereby design freedom of the respective circuits is improved and a room for the output current required in the entire circuit can be designed in connection with a smaller rated current than that for a single output circuit. Variation of the respective output transistors is also lowered as well as a design error with respect to the entire room for the output current can be reduced.

Accordingly, the rated output current required for the entire stabilized power source circuit is easily obtained by providing a plurality of unit output circuits each including an output transistor having a small output current determined by circuit design limitation, by simply connecting the same in parallel, by distributing the respective unit output circuits on the IC in such a manner that the grand total of the output currents of output transistors in the respective unit output circuits corresponds to the rated output current of the stabilized power source circuit and by allocating the areas for the respective unit output circuits. Accordingly, a stabilized power source circuit having a required output current which permits production in an IC form can be designed in short time and reliably.

Figure 2:
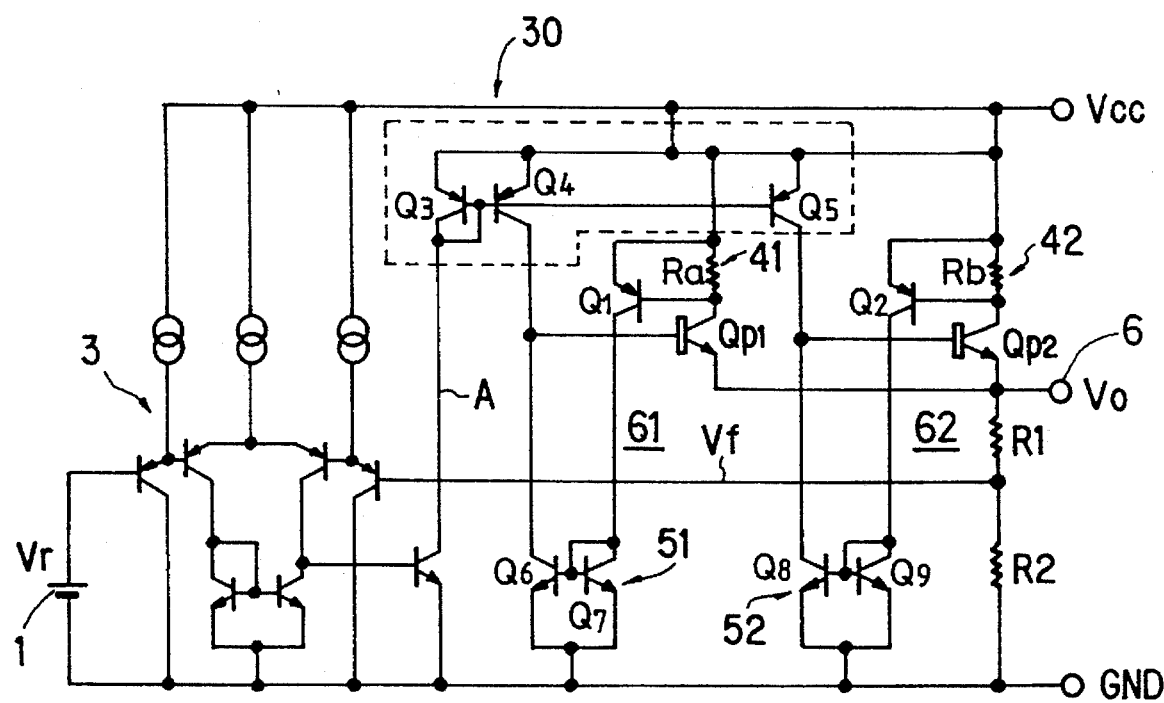
FIG. 2 is a concrete circuit diagram corresponding to the circuit as shown in FIG. 1.

FIG. 2 is a circuit embodying the FIG. 1 circuit wherein the corresponding portions to these of FIG. 1 are denoted by the same reference numerals.

Resistors Ra and Rb are respectively resistors for over current detection and transistors Q1 and Q2 are respectively transistors for over current detection between emitter and base of which the resistors Ra and Rb are respectively connected. The signal distributing circuit 30 is constituted in a current mirror circuit consisting of a transistor Q3 at the input side and transistors Q4 and Q5 at the output side, the subtracting circuits 51 and 52 are respectively constituted in a current mirror circuit consisting of a transistor Q7 which receives the detection signal from the transistor Q1 and transistor Q6 and in a current mirror circuit consisting of a transistor Q9 which receives the detection signal from the transistor Q2 and a transistor Q8, and produce detection current signals having inverted phase with respect to the error signal as their output through the current mirror circuits. Then, the outputs of the inverted phase of the output side transistors Q6 and Q8 in the current mirror circuits are wired-connected to the output side transistors Q4 and Q5 in the signal distributing circuit 30 to thereby produce subtracting signals. The signals at the connection points are applied to the bases of the transistors Qp1 and Qp2.

Figure 3:
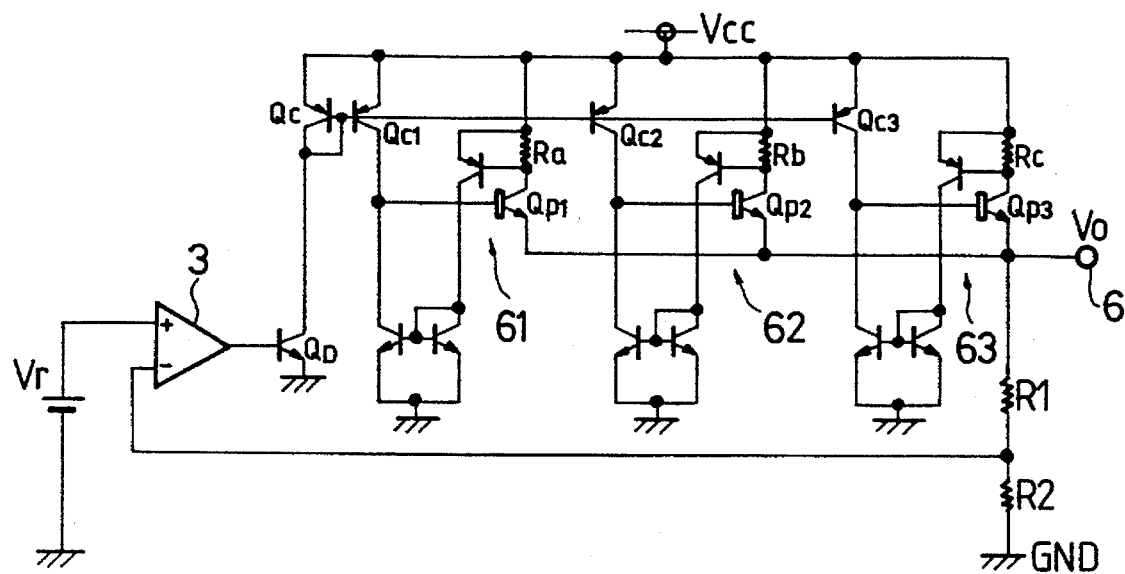
FIG. 3 is a block diagram when the number of unit output circuits in FIG. 2 is increased by one.

FIG. 3 is another embodiment wherein three unit output circuits connected in parallel are included and constituted by adding a further unit output circuit 63 having the similar constitution to the unit output circuits as shown in FIG. 2.

Figure 4:
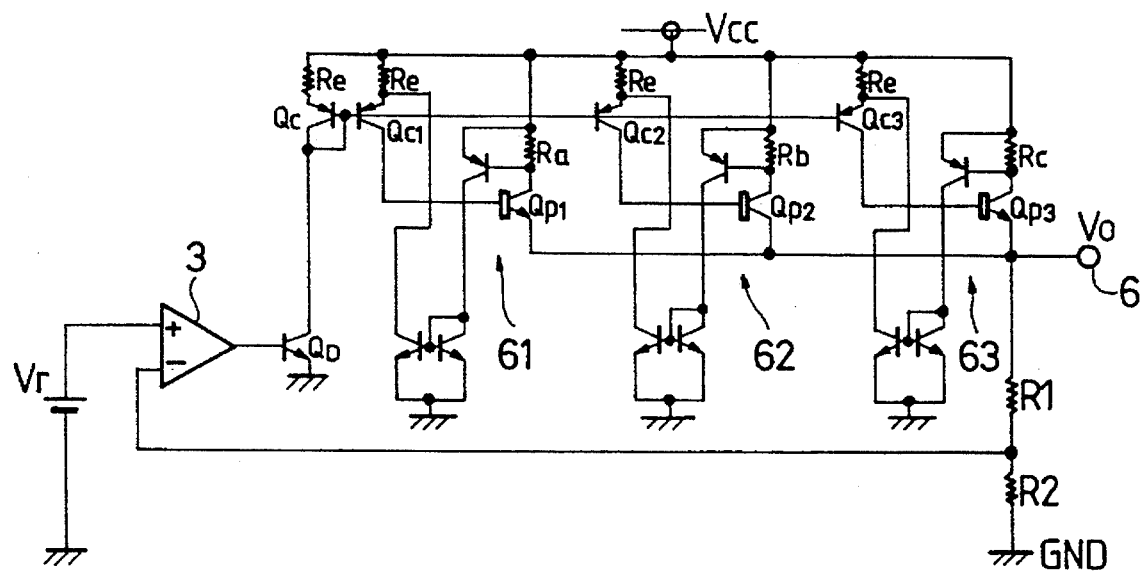
FIG. 4 is a block diagram of another embodiment wherein emitter resistors are provided for the current mirror circuits in FIG. 3.

FIG. 4 is still another embodiment wherein the detection signal is separated from the base of the output transistor, namely respective emitter resistors are provided for the respective transistors in the current mirror circuits of the signal distributing circuit as shown in FIG. 3 and the current of the detection signal is added to the emitter resistor Re at the output side transistor in the current mirror circuit to thereby perform a subtraction processing at the emitter resistor Re.

Figure 5:
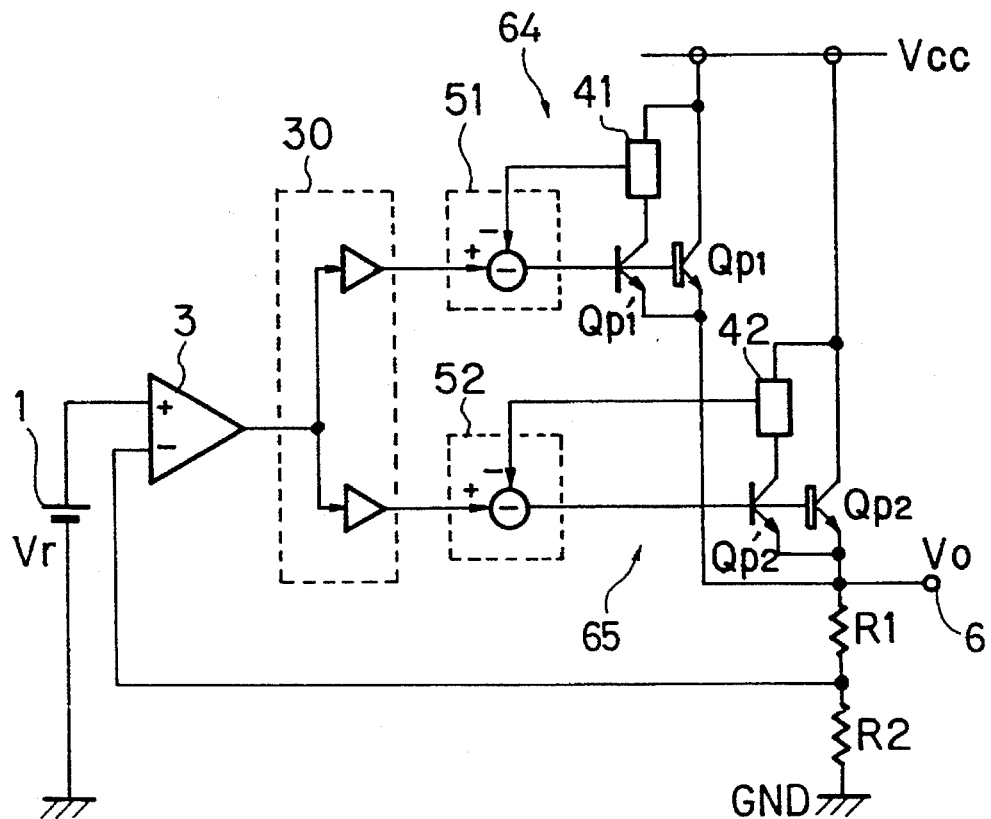
FIG. 5 is a block diagram of still another embodiment according to the present invention having two unit output circuits different from those shown in FIG. 1.
Figure 10:
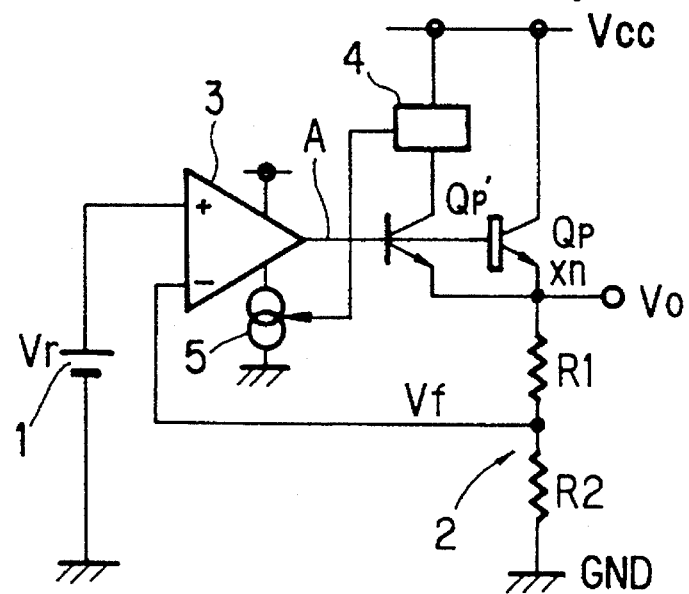
FIG. 10 is a block diagram of another example of conventional IC type stabilized power source circuits.

FIG. 5 is a further embodiment wherein unit output circuits 64 and 65 are provided and like the conventional stabilized power source circuit as illustrated in FIG. 10 the respective unit output circuits 64 and 65 are respectively provided with output transistors Qp1 and Qp2, and over current detection use transistors Qp'1 and Qp'2 each having 1/n emitter area of the concerned output transistor. Thereby, the power loss due to resistors in the over current detection circuits 41 and 42 is kept at a low level.

Figure 6:
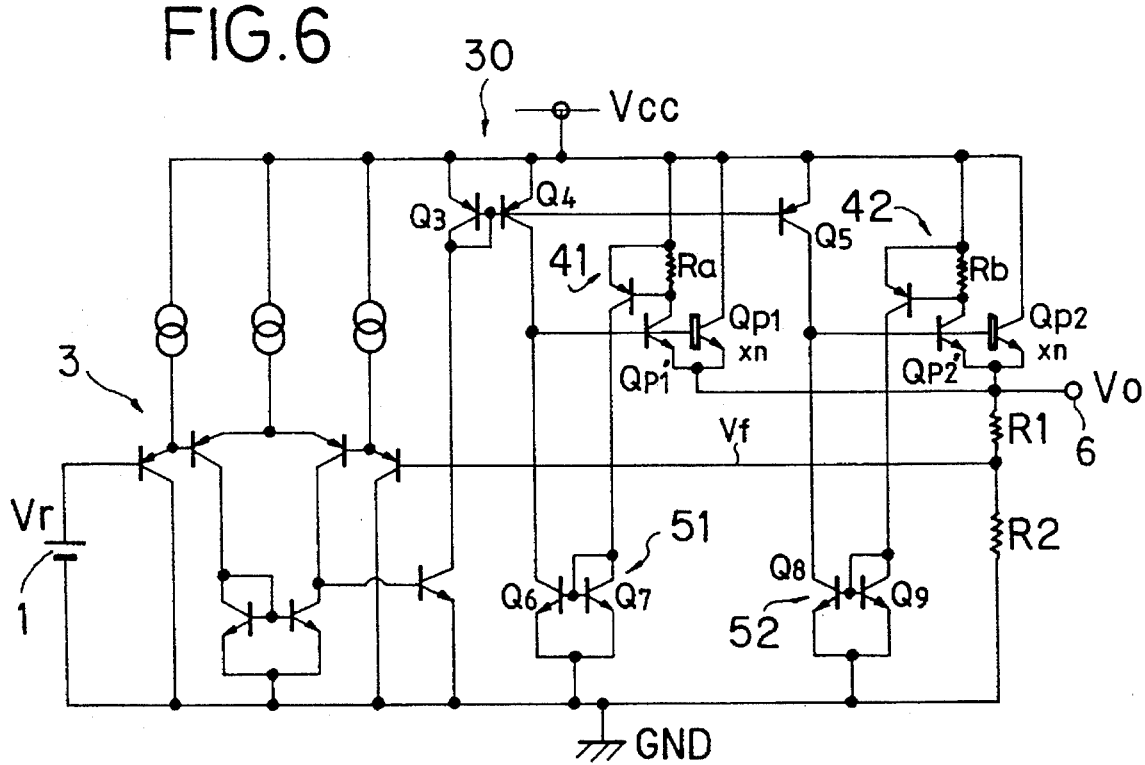
FIG. 6 is a concrete circuit diagram corresponding to the circuit as shown in FIG. 5.

FIG. 6 is a concrete circuit diagram of FIG. 5.

Figure 7:
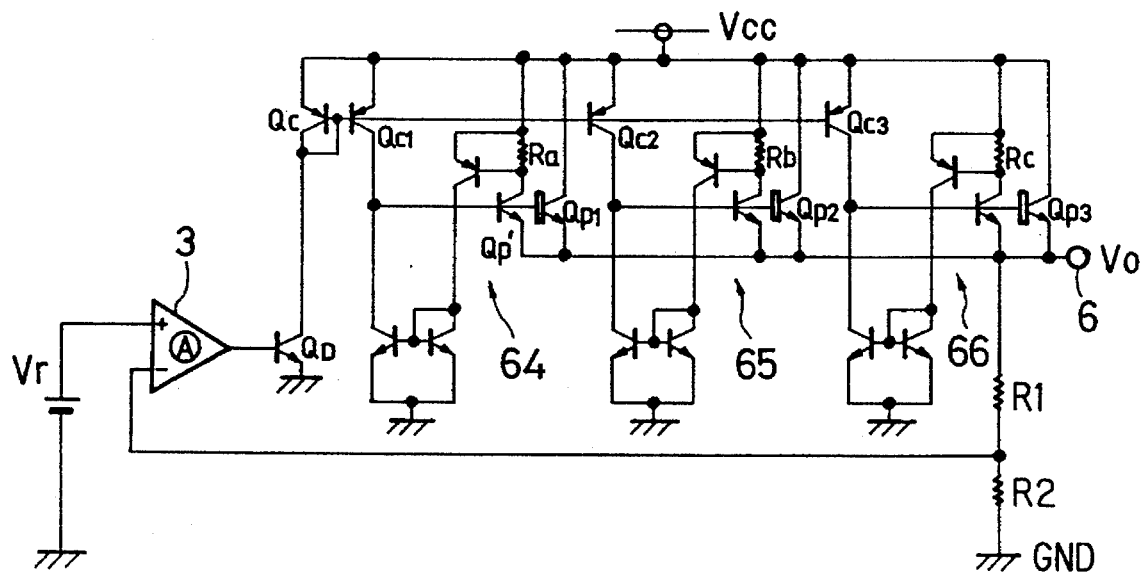
FIG. 7 is a block diagram when the number of unit output circuits in FIG. 6 is increased by one.

FIG. 7 is a still further embodiment wherein three unit output circuits connected in parallel are included and constituted by adding a further unit output circuit 66 having the similar constitution to the unit output circuits 64 and 65 as shown in FIG. 6.

Figure 8:
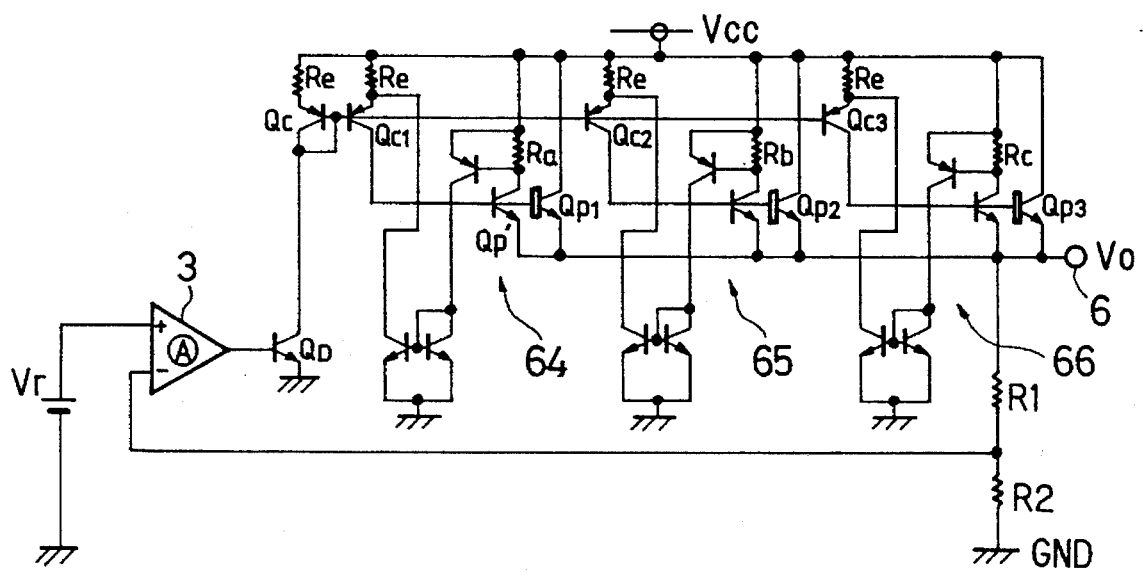
FIG. 8 is a block diagram of a further embodiment wherein emitter resistors are provided for the current mirror circuits in FIG. 7.

FIG. 8 is a similar embodiment as illustrated in FIG. 4 wherein emitter resistors Re are provided for the respective transistors in the current mirror circuits of the signal distributing circuit as shown in FIG. 7.

We claim:

1. An IC type stabilized power source circuit which is designed to obtain an output voltage of a predetermined target voltage as an output of an output transistor through voltage drop of a power source voltage by said output transistor, generates an error signal depending on either the difference between said predetermined target voltage and the actual output voltage or a voltage obtained by multiplying a predetermined rate to the predetermined target voltage and a voltage obtained by multiplying the predetermined rate to the actual output voltage, and controls the output current of said output transistor depending on the error signal so as to stabilize the actual output voltage at said predetermined target voltage, comprising:

n pieces of said output transistors, wherein n is a positive integer equal to 2 or more than 2, each outputting to a common output terminal;

n pieces of over current detection circuits provided for the n pieces of said respective output transistors and outputting respective detection signals when the output currents flowing through said respective corresponding output transistors exceed predetermined rated current values set for said respective corresponding output transistors; and n pieces of control circuits provided for the n pieces of said over current detection circuits and when being received the respective corresponding detection signals each limiting the output currents of said respective corresponding output transistors relating to said over current detection circuits from which the detection signals are received to respective values equal to or less than the respective predetermined rated current values, and wherein the grand total of the respective predetermined rated currents of the n pieces of said respective output transistors is designed to be a rated out current from the common output terminal.

2. An IC type stabilized power source circuit according to claim 1, further comprising, a signal distributing circuit which receives said error signal, generates n pieces of control signals corresponding to the error signal and sends out the n pieces of control signals to said respective n pieces of control circuits, wherein each of said n pieces of control circuits receives said control signal and said detection signal and sends out a signal obtained by subtracting the value of said detection signal from the value of said control signal to the base of said output transistor concerned as a drive signal, and each of said n pieces of over current detection circuits includes a resistor inserted to a collector of the output transistor concerned.

3. An IC type stabilized power source circuit according to claim 2, wherein said signal distributing circuit is constituted in a current mirror circuit and generates n pieces of error signals.

4. An IC type stabilized power source circuit according to claim 3, wherein each of said n pieces of control circuits includes a current mirror circuit which receives the corresponding detection signal, inverts the phase thereof with respect to the control signal concerned and outputs the corresponding detection signal with its inverted phase, and said control signal and the output signal from said current mirror circuit are wired-connected.

5. An IC type stabilized power source circuit according to claim 4, wherein each of said n pieces of output transistors includes a detection use transistor of which a base is connected in common with the output transistor, the resistor of each of said n pieces of over current detection circuits is inserted to a collector of said detection use transistor connected to the output transistor concerned.

6. An IC for feeding an electric power to a load circuit which is designed to obtain an output voltage of a predetermined target voltage as an output of an output transistor through voltage drop of a power source voltage by said output transistor, generates an error signal depending on either the difference between said predetermined target voltage and the actual output voltage or a voltage obtained by multiplying a predetermined rate to the predetermined target voltage and a voltage obtained by multiplying the predetermined rate to the actual output voltage, and controls the output current of said output transistor depending on the error signal so as to stabilize the actual output voltage at said predetermined target voltage, comprising:

n pieces of said output transistors, wherein n is a positive integer equal to 2 or more than 2, each outputting to a common output terminal;

n pieces of over current detection circuits provided for the n pieces of the respective output transistors and outputting respective detection signals when the output currents flowing through said respective corresponding output transistors exceed predetermined rated current values set for said respective corresponding output transistors; and n pieces of control circuits provided for the n pieces of the over current detection circuits and when being received the respective corresponding detection signals each limiting the output currents of the respective corresponding output transistors relating to the over current detection circuits from which the detection signals are received to respective values equal to or less than the respective predetermined rated current values, and wherein the grand total of the respective predetermined rated currents of the n pieces of said respective output transistors is fed to said load circuit as a rated out current from the common output terminal.

7. An IC according to claim 6, further comprising, a signal distributing circuit which receives said error signal, generates n pieces of control signals corresponding to the error signal and sends out the n pieces of control signals to said respective n pieces of control circuits, wherein each of said n pieces of control circuits receives said control signal and said detection signal and sends out a signal obtained by subtracting the value of said detection signal from the value of said control signal to the base of said output transistor concerned as a drive signal, and each of said n pieces of over current detection circuits includes a resistor inserted to the collector of the output transistor concerned.

* * * * *